(12) United States Patent
Kim

(10) Patent No.: US 6,355,878 B1
(45) Date of Patent: Mar. 12, 2002

(54) CLIP TYPE CONDUCTIVE GASKET

(75) Inventor: Sun-Ki Kim, Kyonggi-do (KR)

(73) Assignee: Expan Electronics Co., Ltd., Kyonggi-do (KR)

( * ) Notice: Subject to any disclaimer, the term of this patent is extended or adjusted under 35 U.S.C. 154(b) by 0 days.

(21) Appl. No.: 09/586,808

(22) Filed: Jun. 5, 2000

(30) Foreign Application Priority Data

Dec. 24, 1999 (KR) .............................................. 99-29499

(51) Int. Cl.⁷ ................................................. H05K 9/00
(52) U.S. Cl. .............................. 174/35 GC; 174/35 R; 277/920
(58) Field of Search ................... 174/35 GC, 35 R; 277/920; 439/927; 361/753, 799, 800, 816, 818

(56) References Cited

U.S. PATENT DOCUMENTS

| | | |
|---|---|---|
| 4,525,904 A | 7/1985 | Petri |
| 4,659,869 A | 4/1987 | Busby |
| 4,820,885 A | 4/1989 | Lindsay |
| 4,937,128 A * | 6/1990 | Quiles ........................ 428/156 |
| 5,028,739 A | 7/1991 | Keyser et al. |
| 5,068,493 A * | 11/1991 | Benn, Sr. et al. ....... 174/35 GC |
| 5,107,070 A * | 4/1992 | Benn, Sr. et al. ....... 174/35 GC |
| 5,205,751 A * | 4/1993 | Schwartz et al. .............. 439/86 |
| 5,250,751 A * | 10/1993 | Yamaguchi ............ 174/35 GC |
| 5,524,908 A | 6/1996 | Reis |
| 5,539,149 A | 7/1996 | Gatti |
| 5,977,480 A | 11/1999 | Timieski |
| 6,096,413 A * | 8/2000 | Kalinoski et al. ........... 428/220 |
| 6,188,014 B1 * | 2/2001 | Richard et al. ........... 174/35 R |

\* cited by examiner

Primary Examiner—Dean A. Reichard
Assistant Examiner—Carmelo Oliva
(74) Attorney, Agent, or Firm—Robert E. Bushnell, Esq.

(57) ABSTRACT

A clip type conductive gasket having a conductive metal finger strip that is fitted to a part of an electric or electronic apparatus to be electrically connected or electrically block electromagnetic interference (EMI) and particularly radio frequency interference (RFI). A conductive elastic body is dispensed on an upper portion of the conductive metal finger strip. According to the clip type conductive gasket, a physical binding force is increased, the electrical conductivity and the contact area is increased so that the contact resistance is lowered. Therefore, the manufacturing cost is lowered.

10 Claims, 3 Drawing Sheets

CLIP TYPE CONDUCTIVE GASKET

CLAIM OF PRIORITY

This application makes reference to, incorporates the same herein, and claims all benefits accruing under 35 U.S.C. §119 from an application entitled Clip Type Conductive Gasket earlier filed in the Korean Industrial Property Office on Dec. 24, 1999, and there duly assigned Ser. No. 99-29499 by that Office.

BACKGROUND OF THE INVENTION

1. Field of the Invention

The present invention relates to a conductive gasket, and more particularly, a clip type conductive gasket in which a liquid phase conductive elastic body is provided and cured on a metal finger gasket.

2. Description of the Background Art

Electromagnetic Interference (EMI) concerns an undesirable electrical or electronic interference that is induced or radiated from an electric or electronic apparatus. Radio Frequency Interference (RFI) typically means an electromagnetic wave interference, particularly, the electromagnetic wave interference in a radio frequency band of 10 kHz~10 GHz.

In order to solve the problem of the electromagnetic wave interference in the electric or electronic apparatus, there are many proposed technical methods. Mainly, a method of blocking EMI/RFI is used. In order to block the EMI/RFI, a conductive gasket which absorbs or reflects the EMI/RFI energy and reduces the energy level is provided between the EMI/RFI generating sources or inserted into a place where the EMI/RFI should be blocked. Thus, the conductive gasket forms a conductive barrier between the EMI/RFI generating sources so as to block the EMI/RFI energy, or forms a conductive passage so as to exhaust the EMI/RFI energy by a grounding. This conductive gasket is employed in various fields, for example, a personal communication system.

The conventional embodiments have some problems. First, in case of the conductive elastic gasket, there is a problem that the conductive elastic gasket is easily separated from a conductive rib formed on an electrical apparatus. Particularly, in case that the surface of the conductive rib is so smooth, the interfacial adhesive force between the surface of the conductive rib and the conductive elastic gasket is lowered. Therefore, the conductive elastic gasket is easily separated from the conductive rib. Further, conductive particles distributed in the conductive elastic body are unequally contacted with the surface of the conductive rib, thus an electrical contact resistance therebetween is increased or an electrical conductivity therebetween is decreased. In addition, if a place, to which the conductive elastic gasket is applied, has a small surface, the precise dispenser attached to a three-axis CNC (Computer Numerical Control) robot is needed for dispensing the conductive elastic gasket. Thus, another problem is that the manufacturing cost is increased.

Meanwhile, in a case of a conductive metal finger gasket, since the finger gasket is electrically connected with the conductive member only by the contact of the elastic protrusion of the finger gasket, the contact area is therefore so small that there is a problem of an increased electrical contact resistance. Further, the number of the elastic protrusions is restrained due to the limited size of the finger gasket. Since the conductive member is electrically and mechanically connected with the only elastic protrusion of the finger gasket, when the conductive member is closely contacted with the finger gasket, the EMI/RFI energy is leaked from a portion between the conductive member and the finger gasket, in which the elastic protrusion is not provided.

Exemplars of the background art U.S. Pat. No. 4,659,869 for Clip-On Strip for RFI/EMI Shielding issued to Busby, U.S. Pat. No. 4,820,885 for Magnetic Gasket for Shielding Against Electromagnetic Radiation issued to Lindsay, U.S. Pat. No. 5,977,480 for Grounding and RFI isolation for Control Station issued to Timieski, U.S. Pat. No. 5,028,739 for EMl/RFI Gasket issued to Keyser et al., U.S. Pat. No. 5,539,149 for Radio Frequency Interference Gasket issued to Gatti, U.S. Pat. No. 5,524,908 for Multi-Layer EMI/RFI Gasket Shield issued to Reis, U.S. Pat. No. 4,525,904 for RF Gasket Retainer Clip issued to Petri disclose gaskets for reducing electromagnetic interference and particularly radio frequency interference.

I have found that the background art does not show a single piece clip type gasket that reduces electromagnetic interference and particularly radio frequency interference while reducing the contact resistance and lowering the cost of manufacture.

SUMMARY OF THE INVENTION

The present invention has been made to overcome the above described problems of the background art, and accordingly, it is therefore an object of the present invention to provide a conductive gasket in which a physical binding force is increased.

It is another object to provide a conductive gasket in which an electrical conductivity is equal and the contact area is increased so that the contact resistance is lowered.

It is a further object to provide a conductive gasket that lowers the manufacturing cost.

It is yet another object to provide a conductive gasket that reduces electromagnetic interference and particularly radio frequency interference.

To achieve the above objects and other advantages, there is provided a clip type conductive gasket that is applied to an electric or electronic apparatus to be electrically connected or electrically block EMI/RFI having a conductive metal finger strip that is fitted to a part of the apparatus; and a conductive elastic body that is dispensed on an upper portion of the conductive metal finger strip.

It is preferable that the conductive metal finger strip has a desired length and forms a square pillar which is opened at one side of the square pillar, and the conductive metal finger strip is formed with a bent portion at each side of the conductive metal finger strip. Further, it is preferable that the conductive metal finger strip is an elastic metal and the conductive elastic body contains conductive particles.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
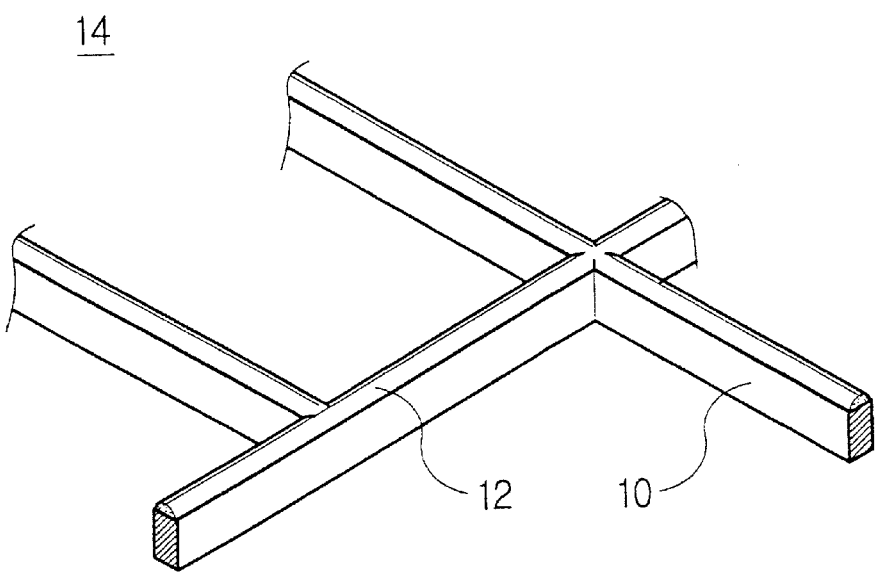
FIG. 1 is a perspective view showing a state that a conductive elastic gasket is applied.

Turning now to the drawings, referring to FIG. 1, a rib 10 is integrally formed in every module unit of a case 14 of the personal communication system to block the electromagnetic wave. On a lower face of the case 14 and a face of the rib 10, a conductive material is deposited or coated by a sputtering or spraying method, or the case 14 itself is formed of a conductive material such as magnesium oxide.

A liquid shape conductive elastic material is exhausted on the conductive rib 10 by a precise dispenser and then curing to form a conductive elastic gasket 12. Since a width of the rib 10 applied to the personal communication system is very narrow due to the miniaturization of the personal communication system, the precise dispenser, that is attached to a three-axis CNC robot, is used to dispense the liquid shape conductive elastic gasket 12 on the conductive rib 10.

After the conductive elastic gasket 12 is formed on the conductive rib 10, as described above, if another conductive member is closely contacted on the conductive elastic gasket 12, the conductive member is electrically and mechanically connected with the conductive elastic gasket 12. At this time, a line contact is provided along the contacted surfaces between the conductive member and the conductive elastic gasket 12. A conductive passage is thus formed via the conductive member, the conductive elastic gasket 12, and the conductive rib 10.

Figure 2A:
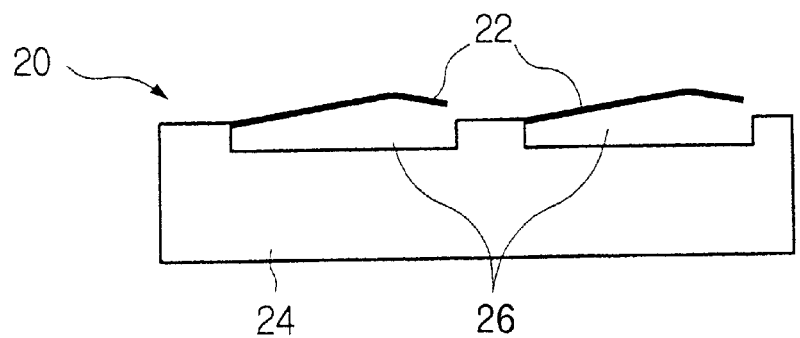
FIG. 2A is a perspective view showing a state that a metal finger gasket is applied.
Figure 2B:
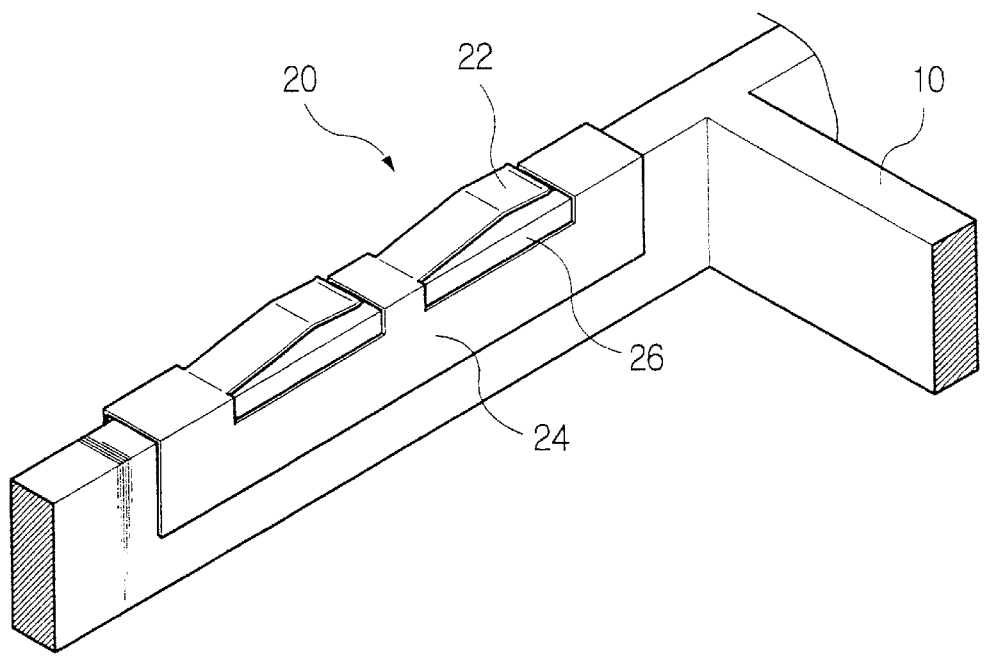
FIG. 2B is a side view of the FIG. 2A.

FIGS. 2A and 2B show another embodiment of a conductive metal finger gasket applied to the personal communication system. The finger gasket 20 is a clip type gasket with an angular c-shaped body 24 with a clip. An opened lower face of the finger gasket 20 is fitted on the conductive rib 10. The finger gasket 20 is made of an elastic metal such as beryllium copper, stainless steel and phosphor bronze, etc. On an upper face of the finger gasket 20, an elastic protrusion 22 is integrally formed with the body 24 of the finger gasket 20. Further, openings 26 are respectively formed on both sides of the finger gasket 20 so that the elastic protrusion 22 can be facilely formed.

In the state that the finger gasket 20 is fitted on the conductive rib 10, if the conductive member is pressed on the upper portion of the finger gasket 20, the conductive member is electrically and mechanically connected with the elastic protrusion 22 of the finger gasket 20. Then, a conductive passage is formed via the conductive member, the elastic protrusion 22 of the conductive gasket 12 and the conductive rib 10.

Figure 3:
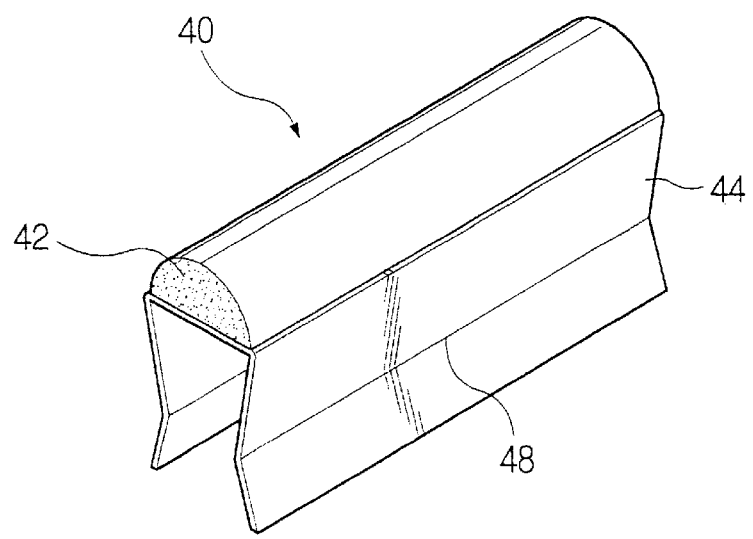
FIG. 3 is a perspective view showing a clip type conductive gasket.

Referring to FIG. 3, a clip type conductive gasket according to the present invention has a conductive metal finger strip 44 that is fitted onto an electric or electronic apparatus. A conductive elastic (or resilient) body 42 is formed on an upper portion of the conductive metal finger strip 44. The conductive metal finger strip 44 is manually manipulatable by a finger. The conductive elastic body 42 has an arcuate shape.

Figure 4:
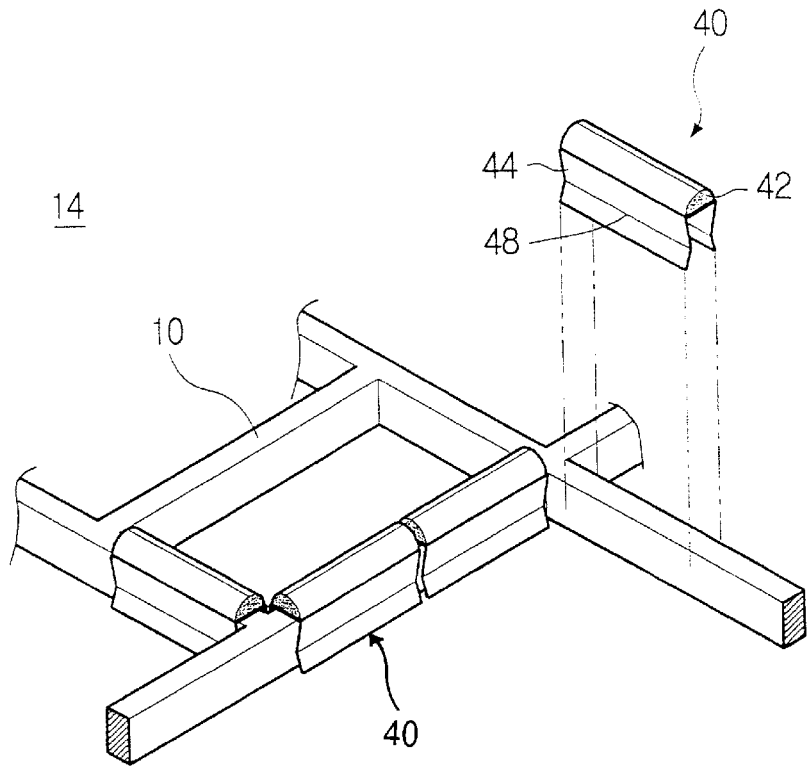
FIG. 4 is a perspective view showing a state that the clip type conductive gasket is applied.

Referring to FIG. 4, the conductive metal finger strip 44 has a desired length and forms a square pillar that is opened at one side of the square pillar so as to have an angular c-shaped section. Preferably, a bent portion 48 is provided on opposite sides of the finger strip 44. Once the finger strip 44 is fitted to the conductive rib 10, the bent portion 48 is pressed on a conductive rib 10 by an elastic force of the finger strip 44. Therefore, the finger strip 44 is not easily separated from a conductive rib 10.

The following will show in more detail a method of manufacturing the clip type conductive gasket and a method of applying the conductive gasket to an electric or electronic apparatus.

First, the finger strip 44 is made to have a desired length. At this time, it is not necessary to from an opening on both sides of the finger strip 44 as described in FIGS. 2A and 2B. That is, since the finger strip 44 does not have any structure such as the conductive protrusion in FIGS. 2A and 2B, the opening is not needed. However, the opening may be provided, if necessary.

Then, a conductive elastic material, for example, conductive elastomer, is dispensed and cured on the upper portion of the finger strip 44, thereby forming a solid conductive elastic gasket.

At this time, the conductive elastic material dispensed on the finger gasket is adhered to the finger gasket by an adhesive material contained in the liquid phase conductive elastic material. That is, the conductive elastic material is adhered to the finger gasket without any other separate adhesive.

Figure 5:
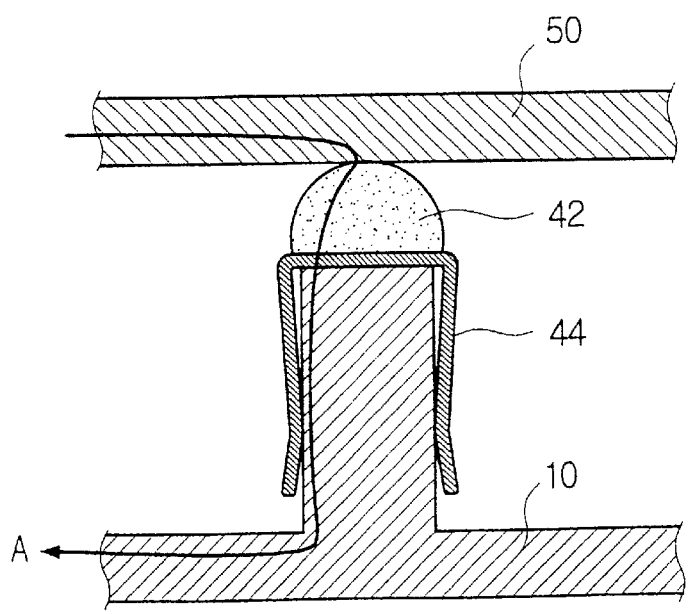
FIG. 5 is a cross-sectional view showing a conductive passage in the clip type conductive gasket.

Referring to FIG. 5, after the clip type conductive gasket 40 is fitted to the conductive rib 10, if the conductive member 50 is pressed on the clip type conductive gasket 40, a conductive passage as indicated by an arrow A is formed via the conductive member 50, the conductive elastic body 42, the metal finger strip 44, and the conductive rib 10.

As described above, the clip type conductive gasket according to the present invention has some advantages. First, in the conventional conductive elastic gasket, since the conductive body should be precisely dispensed on the entire surface of the conductive rib having various shapes, an expensive equipment such as the CNC robot is needed. However, in the clip type conductive gasket according to the present invention, the expensive equipment is not needed.

In addition, since the both sides of the finger strip are respectively formed with a bent portion, the finger strip of the conductive gasket according to the present invention is mechanically coupled to the conductive rib. Therefore, the conductive gasket is not easily separated from the conductive rib.

Further, since the surface roughness of the finger strip is large, the interfacial adhesive force between the conductive elastic body and the finger strip is increased. Thus, the contact area between the conductive particles distributed in the conductive elastic body and the surface of the finger strip is increased so that the electrical conductivity is improved. Particularly, although the surface of conductive rib is treated to be smooth by an plating or depositing process, the electrical conductivity is not effected, since the conductive strip is mechanically coupled to the conductive rib.

Moreover, although a user intends to apply the conductive elastic gasket according to the present invention to only a part of the conductive rib, since the conductive elastic gasket is facilely fitted to the part of the conductive rib, the workability is improved.

This invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A clip type conductive gasket, comprising:

a strip of a conductive metal fitting on a section of an electrical apparatus, said strip manually manipulatable by a finger of a user, said strip having a predetermined length and forming a square pillar having one open side, said strip having a bent portion at each side of said strip, the bent portion forming an electrical contact with said electrical apparatus, said strip clipped on a conductive rib of said electrical apparatus; and a body of a conductive resilient material being dispensed on an upper portion of said strip, said strip with said body electrically connecting or electrically blocking electromagnetic interference including radio frequency interference emitted from the electrical apparatus, said strip and said body forming a gasket having an angular c-shape and said strip having a rough surface increasing an interfacial adhesive force between said strip and said body, said body having an arcuate shape with a flat bottom coupled to a top flat portion of said strip, a top portion of said body in contact with a conductive member of said electrical apparatus, said body comprising of an elastomer material, said elastomer material being an elastic synthetic polymer, said body further comprising an adhesive material, said adhesive material contained in a liquid phase of said body, said adhesive accommodating said body to adhere to said strip.

2. A conductive gasket, comprising:

a strip of an elastic conductive metal clipping on a conductive rib of a personal communication apparatus, said strip manually manipulatable, said strip having a predetermined length and forming a square pillar having one open side, said strip having a flat top wall and two side walls, the two side walls being symmetrically bent, a top portion of the side walls being inwardly bent and a bottom portion of the side walls bent outwardly; and a body of a conductive resilient material being dispensed on an upper portion of said strip, said body in contact with a conductive member of the personal communication apparatus, said body having an adhesive material adhering said body to the top portion of said strip, said body having conductive particles accommodating an electrical path from the conductive member to the conductive rib through said body and said strip, said strip with said body blocking electromagnetic interference including radio frequency interference emitted from the personal communication apparatus.

3. The conductive gasket of claim 2, with said body having a right semi-circular cylindrical shape, a flat bottom portion of said body adhering to the flat top wall of said strip.

4. The conductive gasket of claim 3, with said body comprising of an elastomer material, said elastomer material being an elastic synthetic polymer.

5. A method of manufacturing a conductive gasket, comprising the steps of:

forming a strip of a desired length, said strip being of an elastic conductive metal manually manipulatable;

forming said strip into a rectangular pillar having one open side, said strip having a top wall connecting two side walls;

adding adhesive material to a conductive elastic material in a liquid phase;

dispensing in the liquid phase said conductive elastic material on the top portion of said strip;

adhering said conductive elastic material to the top portion of said strip by the adhesive material in the liquid phase of said conductive elastic material;

curing said conductive elastic material on the top portion of said strip into a solid body;

fitting said strip to a conductive rib integrally formed in a case of an electrical apparatus; and pressing the body against a conductive member of the electrical apparatus, forming a conductive path via the conductive member, said body, said strip, and the conductive rib of the electrical apparatus, said strip with said body blocking electromagnetic interference including radio frequency interference emitted from said electrical apparatus.

6. The method of claim 5, with said step of forming said strip further comprising the step of bending symmetrically both side walls of said strip, bending a top portion of the side walls inwardly and bending a bottom portion of the side walls outwardly.

7. The method of claim 6, with said step of curing said conductive elastic material further comprising the step of forming said conductive elastic material into an arch shaped solid body.

8. The method of claim 7, with said body comprising of an elastomer material, said elastomer material being an elastic synthetic polymer.

9. The method of claim 8, with said body having conductive particles accommodating the conductive path from the conductive member of the electrical apparatus.

10. The method of claim 9, with said step of fitting said strip further comprising the step of pressing said strip on said conductive rib by an elastic force of said strip and contacting a bent portion of each of the side walls of said strip to said conducting rib.

* * * * *